(12) United States Patent
Kim et al.

(10) Patent No.: US 6,635,524 B2
(45) Date of Patent: Oct. 21, 2003

(54) METHOD FOR FABRICATING CAPACITOR OF SEMICONDUCTOR MEMORY DEVICE

(75) Inventors: Kyong-Min Kim, Ichon (KR); Ki-Seon Park, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/166,602

(22) Filed: Jun. 12, 2002

(65) Prior Publication Data

US 2003/0008455 A1 Jan. 9, 2003

(30) Foreign Application Priority Data

Jun. 12, 2001 (KR) .......................... 2001-32688

(51) Int. Cl.[7] .......................................... H01L 21/8242
(52) U.S. Cl. ...................................... 438/240; 438/381
(58) Field of Search ............................ 438/3, 238–240, 438/250–256, 381, 393–399

(56) References Cited

U.S. PATENT DOCUMENTS

| 5,886,368 A | 3/1999 | Forbes et al. |
| 5,926,740 A | 7/1999 | Forbes et al. |
| 5,985,730 A | 11/1999 | Lim |
| 6,015,917 A | 1/2000 | Bhandari et al. |
| 6,031,263 A | 2/2000 | Forbes et al. |
| 6,057,628 A | 5/2000 | Viljoen et al. |
| 6,114,198 A | * 9/2000 | Huang et al. ............. 438/239 |
| 6,166,401 A | 12/2000 | Forbes |

FOREIGN PATENT DOCUMENTS

| KR | 1999-6061 | 1/1999 |
| KR | 1999-48782 | 8/2000 |

* cited by examiner

*Primary Examiner*—Jey Tsai
(74) *Attorney, Agent, or Firm*—Birch, Stewart, Kolasch & Birch, LLP

(57) ABSTRACT

A method of manufacturing a capacitor having a tantalum-contained-dielectric layer including the steps of forming a lower electrode on a semiconductor substrate; forming a dielectric layer containing Ta element on the lower electrode; forming a nitride layer on the nitride layer by performing a nitrogen plasma treatment; depositing a first TiN layer for a top electrode on the dielectric layer by using a plasma enhanced chemical vapor deposition (PECVD) method; and depositing a second TiN layer for the top electrode on the first TiN layer by using a low pressure chemical vapor deposition (LPCVD) method.

23 Claims, 3 Drawing Sheets

METHOD FOR FABRICATING CAPACITOR OF SEMICONDUCTOR MEMORY DEVICE

This nonprovisional application claims priority under 35 U.S.C. §119(a) on patent application Ser. No. 2001-32688 filed in Korea on Jun. 12, 2001, which is herein incorporated by reference.

FIELD OF THE INVENTION

The present invention relates to a method for fabricating a semiconductor memory device; and more particularly, to a method for fabricating a capacitor of the semiconductor memory device.

BACKGROUND OF THE INVENTION

A Dynamic Random Access Memory (DRAM) cell is a semiconductor memory device typically including one transistor and one capacitor, in which one bit of data is stored in a cell by using an electric charge.

A capacitor has a lower electrode, a dielectric layer, and an upper electrode. One electrode of the lower electrode and the upper electrode is connected to the source/drain junction of the transistor, and the other electrode is connected to a reference voltage line.

As the integration of the DRAM is increased, the size of the memory cell is decreased. However, it is impossible to reduce the size of the memory cell in proportion to the reduction of the DRAM size, because an adequate amount of the capacitance is needed to prevent soft error and to maintain stable operation. There have been efforts to obtain the adequate capacitance by reducing the thickness of the dielectric layer, increasing the effective area and using material having high dielectric constant.

The dielectric layer of a conventional capacitor is formed with a $SiO_2$ layer, a nitride-oxide (NO) layer or an oxide-nitride-oxide (ONO) layer. The NO layer and the ONO layer are formed with $Si_3N_4$ of which the dielectric constant is two times as high as that of the $SiO_2$ layer.

However, it is impossible to get high capacitance from the $SiO_2$ layer, $Si_3N_4$ layer, NO layer and ONO layer because of the relatively low dielectric constant of the dielectric layers, even though the thickness of the dielectric layers are reduced and the areas are increased. Therefore, dielectric layers, such as (Ba, Sr) $TiO_3$ (hereinafter referred as "BST") layer, (Pb, Zr) $TiO_3$ (hereinafter referred as PZT) layer and $Ta_2O_5$ layer, having high dielectric constant are used as a dielectric layer of the capacitor.

The dielectric constant of the $Ta_2O_5$ is about 20 to 25, which is three times as high as that of the $Si_3N_4$. Further, it is relatively easier to etch the $Ta_2O_5$ layer than the BST layer and PZT layer. Also, the $Ta_2O_5$ layer formed by the chemical vapor deposition (CVD) method has a beneficial characteristic of step coverage. However, it is difficult to compose the $Ta_2O_5$ layer with the proper stoichiometry. Therefore, recently, the TaON layer has been suggested to overcome the stoichiometry problem of the $Ta_2O_5$ layer.

The characteristic of the $Ta_2O_5$ layer depends on the electrodes of a capacitor. A capacitor with a $Ta_2O_5$ layer as a dielectric layer has a MIS structure. Herein, "M" is a metal layer for forming the plate line; "I" is an insulating layer i.e., the dielectric layer of the capacitor; and, "S" is a polysilicon layer for forming storage electrode. The plate line of the capacitor having the $Ta_2O_5$ layer also may be formed with stacked layers of polysilicon layer/TiN layer or polysilicon layer/WN layer. The storage electrode also may be formed with a polysilicon layer of which the surface is treated with nitrogen by the rapid thermal nitration (RTN) process.

In a Metal/Insulator/Silicon (MIS) structure, the thickness of $Ta_2O_5$ can be reduced to secure proper capacitance needed in a highly integrated circuit device. Thermal treatment performed after the formation of the capacitor is important when considering a reduction in the thickness of the $Ta_2O_5$ layer. That is, the thermal burdens of subsequent processes are less, so it is possible to make a relatively thinner $Ta_2O_5$ layer. The minimum thickness of the $Ta_2O_5$ layer is not clearly proven, but the limit is presumed to be about 20–30 Å. If thickness of the $Ta_2O_5$ layer is decreased more than the limit, the problem of the increasing leakage current occurs.

In order to reduce the thickness of the dielectric layer, the lower electrode may be formed with metal instead of polysilicon. When the lower electrode is formed with metal, the natural oxide, which becomes a disturbance to reducing the thickness of dielectric layer, is not formed on the surface of the lower electrode. Accordingly, it is possible to reduce the thickness of $Ta_2O_5$ layer by forming the lower electrode with metal instead of polysilicon.

However, the characteristic of the leakage current is influenced greatly by the quality of the lower electrode when the lower electrode is made with metal. Accordingly, a barrier layer should be formed under the lower electrode to prevent the reaction between the metal layer and the polysilicon plug (or a silicon substrate) and to prevent the diffusion of the oxygen used as a source for forming a dielectric layer, when the lower electrode is made with a metal layer.

In the meantime, the dielectric characteristic of a tantalum-contained-oxide layer, such as $Ta_2O_5$ and TiON, depends on the material of the upper electrode.

The TiN layer is relatively stable among the conductive materials, and the TiN layer has adequate step coverage because the TiN layer can be formed by the chemical vapor deposition method. Therefore, the TiN layer is widely used to form the upper electrode.

In the case of forming the upper electrode with TiN, the good electric characteristic of a capacitor can be obtained by the TiN layer formed at a relatively low temperature rather than at a relatively high temperature. However, if the TiN layer is formed at a low temperature, the tantalum-contained-oxide layer, such as $Ta_2O_5$ and TiON, is damaged by Cl radical generated by the source material $TiCl_4$. In addition, the structure of the TiN layer formed at a low temperature is not dense, allowing deoxidized Ta elements to remain at the interface between the tantalum-contained-oxide layer and the TiN layer. Also, the leakage current caused by the Ta elements deteriorates the electric characteristic of the capacitor.

SUMMARY OF THE INVENTION

It is, therefore, an object of the present invention to provide a method of forming a capacitor having a tantalum-contained-dielectric layer.

It is, therefore, another object of the present invention to provide a method of forming a capacitor capable of obtaining good electric characteristic and reducing damage resulting from Cl radicals.

In accordance with one embodiment of the present invention, there is provided a method of forming capacitor of semiconductor device, including the steps of: forming a lower electrode on a semiconductor substrate; forming a dielectric layer containing Ta element on the lower electrode; forming a nitride layer on the dielectric layer by performing a nitrogen plasma treatment; depositing a first TiN layer for a top electrode on the nitride layer by using a plasma enhanced chemical vapor deposition (PECVD) method; and depositing a second TiN layer for the top electrode on the first TiN layer by using a low pressure chemical vapor deposition (LPCVD) method.

In accordance with a second embodiment of the present invention, there is provided a method of forming a capacitor of a semiconductor device including the steps of: forming a lower electrode on a semiconductor substrate; forming a dielectric layer containing a Ta element on the lower electrode; forming a nitride layer on the dielectric layer; depositing a first TiN layer for a top electrode on the nitride layer; and depositing a second TiN layer for the top electrode on the first TiN layer.

In accordance with a third embodiment of the present invention, there is provided present a capacitor for a semiconductor device that includes a semiconductor substrate; a lower electrode over the substrate; a dielectric layer over the lower electrode; an upper electrode over the dielectric layer having a first layer and a second layer; and a nitride layer between the dielectric layer and the upper electrode.

These and other objects of the present invention will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

The preferred embodiment of the present invention relates to a method of forming a capacitor having a Ta-contained-dielectric layer, such as $Ta_2O_5$ and TaON. A nitride layer is formed on the surface of the Ta-contained-dielectric layer, before depositing a TiN layer as an upper electrode of capacitor, in order to prevent the Ta-contained-dielectric layer from being damaged by the Cl radical generated during the deposition of TiN. A plasma treatment, using $NH_3$ etc., is preformed to form the nitride layer.

After forming the nitride layer, a first TiN layer for the upper electrode is formed on the nitride layer by a method such as plasma enhanced chemical vapor deposition (PECVD) method to minimize interface reaction of the TiN layer and the Ta-contained dielectric layer. A second TiN layer for the upper electrode is formed by a method such as a low pressure chemical vapor deposition (LPCVD) to obtain good step coverage. Therefore, the electrical properties of the upper electrode of capacitor are guaranteed by the first TiN layer formed with the PECVD method, and the step coverage of the upper electrode is guaranteed by the second TiN layer formed with the LPCVD method. Preferably, the first TiN layer and the second TiN layer are formed in one chamber, in-situ.

Each of the lower electrode and the upper electrode is a charge storage electrode and a cell plate.

The charge storage electrode may be formed in various structures, such as a simple stack structure, a cylinder structure, a multi-fin structure and a concave structure.

Figure 5:
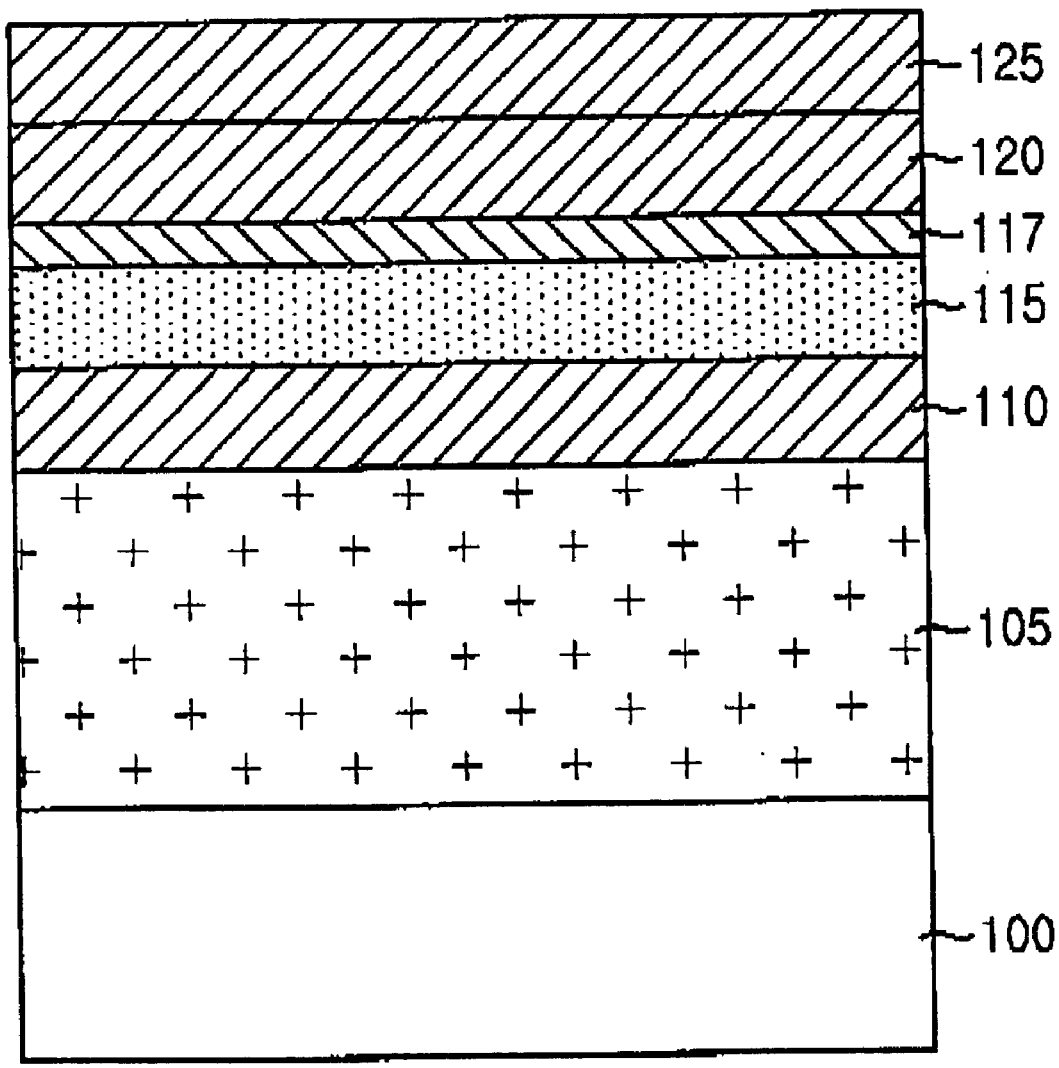

FIG. 5 depicts one embodiment of a capacitor semiconductor memory device formed according to a preferred embodiment of the present invention. The capacitor is formed over a semiconductor substrate 100 on which a silicon plug 105 is already formed. A lower electrode 110 is formed over the silicon plug 105 and the lower electrode 110 is formed of TiN, for example. A dielectric layer 115 is formed over the lower electrode 110. A nitride layer 117 is formed over the dielectric layer 115. The upper electrode is formed over the nitride layer 117 and includes two layers 120 and 125 which may be formed of TiN, for example.

Hereinafter, a semiconductor memory device fabrication method according to embodiments of the present invention will be described in detail referring to the accompanying drawings.

Figure 1:
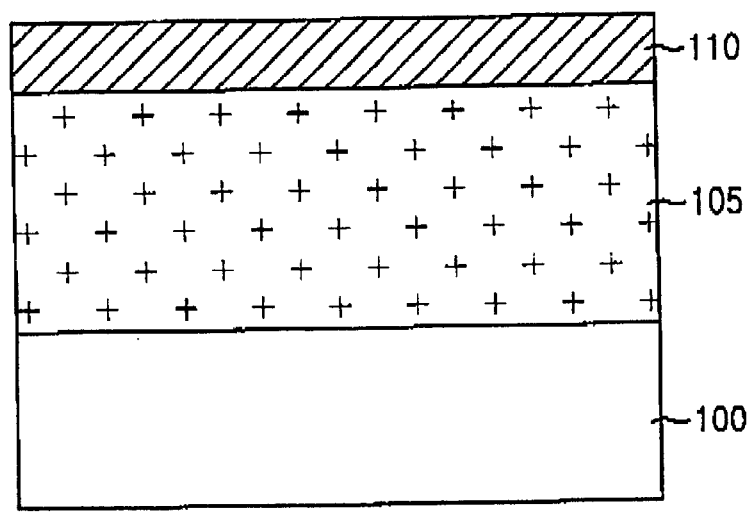
FIGS. 1 to 5 are cross sectional views showing a method for forming a capacitor according to one embodiment of the present invention.

First, Referring to FIG. 1, a polysilicon plug 105 is formed on a semiconductor substrate 100 having a predetermined lower structure, and a TiN lower electrode 110 connected to the polysilicon plug 105 is formed. The predetermined lower structure includes an isolation layer and a MOSFET transistor including a gate oxide, gate electrode and source/drain. After forming the polysilicon silicon plug 105, the surface of the polysilicon plug is etched with an HF solution or a buffered oxide etchant (BOE) solution to remove a native oxide. The lower electrode 105 may be formed after forming a Ti layer as a glue layer and a TiN layer as a diffusion barrier on the polysilicon plug 105.

Figure 2:
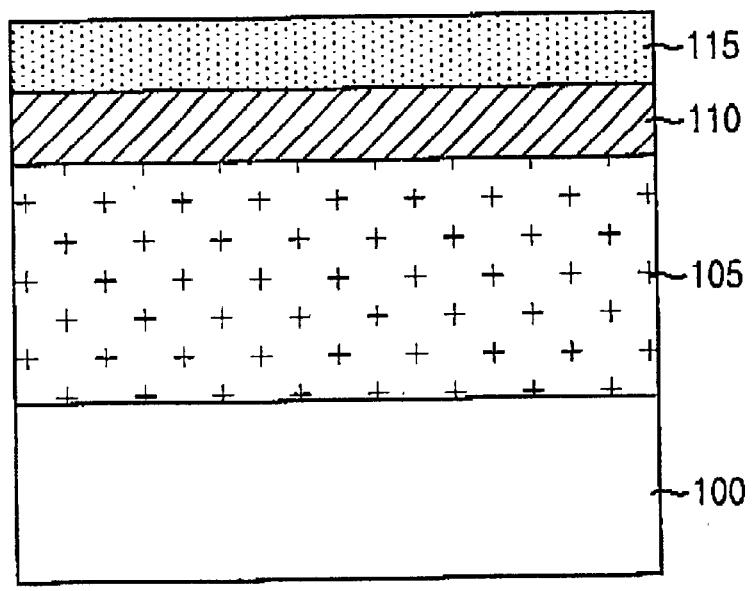
Figure 3:
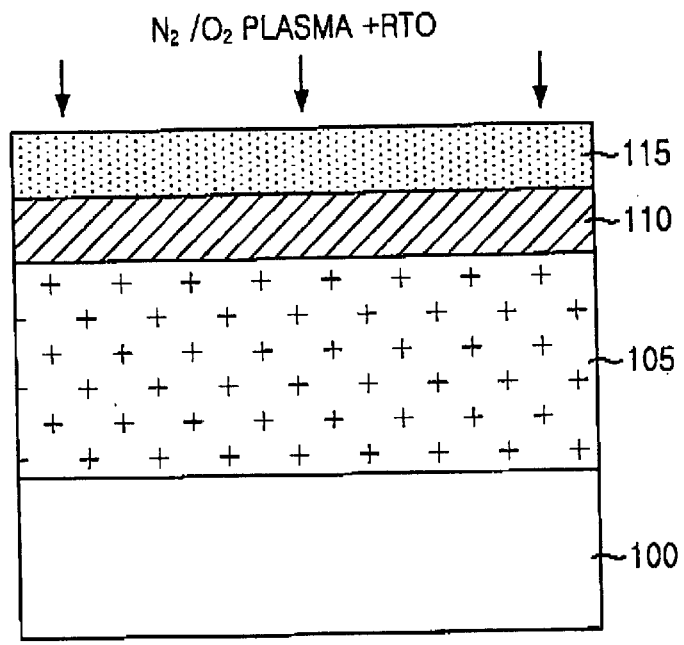

Referring to FIG. 2, a dielectric layer 115 including Ta element, such as a TaON layer and a $Ta_2O_5$ layer, is formed on the lower electrode 110. In the preferred embodiment of the present invention, the dielectric layer 115 is formed with a TaON layer and in the following conditions. The reaction source Ta $(OC_2H_5)_5$ for forming TaON is vaporized in the vaporizer maintaining a temperature of about 170–190° C., because the state of the Ta $(OC_2H_5)_5$ source is liquid at the room temperature. An $NH_3$ reaction gas is flowed at rates of 10–1000 sccm and the pressure of the chamber is maintained at the ranges of 0.1–2 Torr. The dielectric layer 115 is formed on a wafer heated to 300–400° C.

Subsequently, the dielectric layer 115 is annealed in an ambient containing oxygen. For an example, a plasma treatment is performed at a temperature of about 300–500° C. for about 1–5 minutes using $N_2$ gas and $O_2$ gas to remove oxygen vacancies and carbon in the dielectric layer 115. The plasma treatment can be replaced with other suitable treatments such as an ultraviolet-ozone (UV-$O_3$) treatment. After the plasma treatment or the UV-$O_3$ treatment, a second annealing process is performed. The second annealing includes a rapid thermal oxidation (RTO) process is performed at a temperature of about 500–650° C. for about 30–60 seconds using a $N_2$ gas and an $O_2$ gas, for the purposes of stabilizing the interface of the dielectric layer 115 and the lower electrode 110 and increasing the inductive capacity of the dielectric layer 115 by crystallizing the dielectric layer 115.

Figure 4:
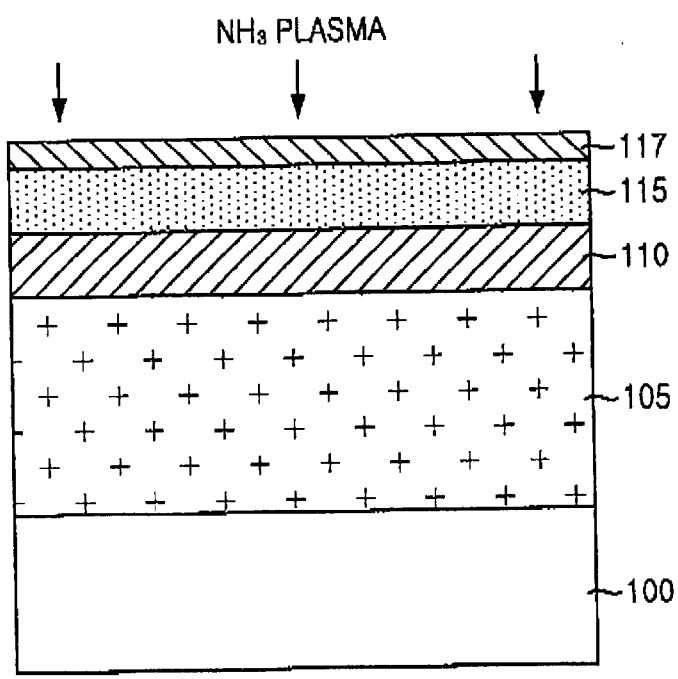

Thereafter, as shown in FIG. 4, the surface of the dielectric layer 115 is treated with nitrogen plasma treatment using NH₃ gas. As a result of the NH₃ plasma treatment, the amount of oxygen in the dielectric layer 115 is reduced, and a nitride layer 117 is formed on the surface of the dielectric layer 115. The effect due to Cl radical generated during the formation of the upper electrode with TiN can be reduced by the nitride layer 117 formed on the surface of the dielectric layer 115.

At this time, the gas flow rate of NH₃ gas is about 10–1000 sccm, the RF power is approximately 30–1000 watts, the pressure is 0.1–2 Torr, and the plasma treatment time is 1–120 seconds.

Referring to FIG. 5, a first TiN layer 120 is deposited, for example, with the PECVD method, and then a second TiN layer 125 is deposited, for example, with the LPCVD method to form the upper electrode.

The deposition method of the first TiN layer 120 using PECVD is as follows. TiCl₄ gas is used as a source material, and NH₃ is used as a reaction gas. The amount of the TiCl₄ gas is about 50–400 mg, and the amount of the NH₃ gas is 10–1000 sccm. The first TiN layer 120 is deposited at a temperature of about 500–600° C., and at the pressure of about 100 mTorr–10 Torr, with the RF power about 30–400 watts. Preferably, the first TiN layer 120 is deposited in a chamber having a sub-heater connected to the ground, and a shower head shaped electrode.

The deposition method of the second TiN layer 125 using LPCVD is as followings. The TiCl₄ gas and the NH₃ gas are also used as a source material and as a reaction gas, respectively. The amount of the TiCl₄ gas is about 50–400 mg, and the amount of the NH₃ gas is about 10–1000 sccm. The first TiN layer 120 is deposited at the temperature of about 500–600° C., and at the pressure of about 100 mTorr–10 Torr, with the RF power about 30–400 watts. Preferably, the second TiN layer 125 is deposited in a chamber having a sub-heater connected to the ground, and a shower head shaped electrode.

In the preferred embodiment of the present invention, the first TiN layer 120 and the second TiN layer 125 are formed in-situ. For example, the first TiN layer 120 and the second TiN layer 125 are deposited in the same chamber without moving the substrate.

In the above-mentioned embodiment showing the formation method of the capacitor having MIN structure, both lower electrode and upper electrode are formed with TiN. However, the lower electrode may be formed with Ru, Pt, Ir, Os, W, Mo, Co, Ni, Au, Ag, RuO₂ or IrO₂, etc. Also, the lower electrode may be formed with a doped polysilicon to form a capacitor having MIS structure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming capacitor of semiconductor device, comprising the steps of:
   forming a lower electrode on a semiconductor substrate;
   forming a dielectric layer containing a Ta element on the lower electrode;
   forming a nitride layer on the dielectric layer by performing a nitrogen plasma treatment;
   depositing a first TiN layer for a top electrode on the nitride layer by using a plasma enhanced chemical vapor deposition (PECVD) method; and
   depositing a second TiN layer for the top electrode on the first TiN layer by using a low pressure chemical vapor deposition (LPCVD) method.

2. The method as recited in claim 1, wherein the dielectric layer is formed with TaON or Ta₂O₅.

3. The method as recited in claim 2, wherein the step of forming the dielectric layer includes the steps of:
   forming the dielectric layer using TaON; and
   annealing the dielectric layer in an ambient of oxygen.

4. The method as recited in claim 3, wherein the step of annealing the dielectric layer includes the steps of:
   performing a first annealing, wherein the first annealing is performed with plasma produced by N₂ gas and O₂ gas, or the first annealing is performed with ultraviolet light and O₃;
   performing a second annealing including a rapid thermal oxidation process using N₂ gas and O₂ gas.

5. The method as recited in claim 3, wherein a vaporized Ta (OC₂H₅)₅ is used as a source gas in the step of forming the dielectric layer.

6. The method as recited in claim 5, wherein a NH₃ gas is used as a reaction gas in the step of forming the dielectric layer.

7. The method as recited in claim 6, wherein the dielectric layer is formed at the pressure of 0.1–2 Torr.

8. The method as recited in claim 6, wherein the step of forming the dielectric layer includes forming the dielectric layer on the semiconductor substrate and heating the semiconductor substrate to a temperature of 300–400° C.

9. The method as recited in claim 4, wherein the step of performing the first annealing is performed at a temperature of 300–500° C. for 1–5 minutes.

10. The method as recited in claim 4, wherein the second annealing is performed at a temperature of 500–650° C. for 30–60 seconds.

11. The method as recited in claim 1, wherein the nitrogen plasma treatment uses NH₃ gas.

12. The method as recited in claim 11, wherein 30–1000 watts of RF power is applied to produce the plasma in the nitrogen plasma treatment, and the nitrogen plasma treatment is performed at a pressure of 0.1–2 Torr.

13. The method as recited in claim 1, wherein the lower electrode is formed with a material selected from a group comprising TIN, Ru, Pt, Ir, Os, W, Mo, Co, Ni, Au, Ag, RUO₂ and IrO₂.

14. The method as recited in claim 1, wherein the step of depositing the first TiN layer includes using TiCl₄ as a source.

15. The method as recited in claim 14, wherein an NH₃ gas is used as a reaction gas for depositing the first TiN layer.

16. The method as recited in claim 15, wherein the first TiN layer is deposited at a temperature of 500–600° C. and at a pressure of 100 mTorr–10 Torr.

17. The method as recited in claim 1, wherein the step of depositing the second TIN layer includes using TiCl₄ as a source.

18. The method as recited in claim 17, wherein an NH₃ gas is used as a reaction gas in the step of depositing the second TiN layer.

19. The method as recited in claim 18, wherein the second TiN layer is deposited at a temperature of 500–600° C. and at a pressure of 100 mTorr–10 Torr.

20. A method of forming capacitor of semiconductor device, comprising the steps of:
   forming a lower electrode on a semiconductor substrate;
   forming a dielectric layer containing a Ta element on the lower electrode;

forming a nitride layer on the dielectric layer;

depositing a first TiN layer for a top electrode on the dielectric layer; and depositing a second TiN layer for the top electrode on the first TiN layer.

21. The method of claim 20, wherein the step of forming a nitride layer on the nitride layer includes performing a nitrogen plasma treatment.

22. The method of claim 20, wherein the step of depositing a first TiN layer includes using a plasma enhanced chemical vapor deposition (PECVD) method.

23. The method of claim 20, wherein the step of depositing a second TiN layer for the top electrode includes using a low pressure chemical vapor deposition (LPCVD) method.

* * * * *